United States Patent
Kub et al.

(10) Patent No.: US 7,282,753 B2
(45) Date of Patent: Oct. 16, 2007

(54) VERTICAL CONDUCTING POWER SEMICONDUCTING DEVICES MADE BY DEEP REACTIVE ION ETCHING

(75) Inventors: Francis J. Kub, Arnold, MD (US); Karl D. Hobart, Upper Marlboro, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 11/534,310

(22) Filed: Sep. 22, 2006

(65) Prior Publication Data

US 2007/0018179 A1  Jan. 25, 2007

Related U.S. Application Data

(62) Division of application No. 10/278,861, filed on Oct. 24, 2002, now Pat. No. 7,132,321.

(51) Int. Cl.
*H01L 29/76* (2006.01)

(52) U.S. Cl. ............... 257/288; 257/302; 257/E29.189

(58) Field of Classification Search ............... 257/213, 257/288, 299, 302, 619–626, E29.189, E29.198, 257/E29.257, E29.262, E29.274, E29.186, 257/296
See application file for complete search history.

(56) References Cited

U.S. PATENT DOCUMENTS

| | | | |
|---|---|---|---|
| 3,928,091 A | 12/1975 | Tachi et al. | |
| 5,162,258 A | 11/1992 | Lemnios et al. | |
| 5,233,219 A * | 8/1993 | Shimoji et al. | ............. 257/623 |
| 5,496,755 A | 3/1996 | Bayraktaroglu | |
| 5,643,803 A | 7/1997 | Fukada et al. | |
| 5,698,453 A | 12/1997 | Green et al. | |
| 5,827,755 A | 10/1998 | Yonehara et al. | |
| 6,081,006 A | 6/2000 | Nelson | |
| 6,096,656 A | 8/2000 | Matzke et al. | |

* cited by examiner

*Primary Examiner*—Brook Kebede
(74) *Attorney, Agent, or Firm*—Thomas D. Robbins; John J. Karasek

(57) ABSTRACT

The Invention Is A Method For Making Power Device On A Semiconductor Wafer, Where The Backside Of The Wafer Has Been Thinned In Selected Regions To A Thickness Of About 25 Um By Reactive Ion Etching.

6 Claims, 12 Drawing Sheets

VERTICAL CONDUCTING POWER SEMICONDUCTING DEVICES MADE BY DEEP REACTIVE ION ETCHING

CROSS-REFERENCE TO RELATED APPLICATIONS

This Application is a Division of application Ser. No. 10/278,861 filed on Oct. 24, 2002 now U.S. Pat. No. 7,132,321.

BACKGROUND OF THE INVENTION

1. Field of the Invention

This invention relates to the production of thinned semiconductor wafers which are made from thick (100 μm to 700 μm) wafers that are thinned from the backside (or potentially front side) only in selected regions.

2. Description of the Previously Published Art

There are several companies that are attempting to make Insulated Gate Bipolar Transistors (IGBTs) that have a semiconductor wafer thickness between 100 μm and 200 μm. The main problems in making these devices in a manufacturing environment are wafer warpage, wafer breakage, and difficulty of using automated equipment.

There are devices where it would be desirable to have power devices with a total thickness of 25 μm. These power devices include fast recovery 200V PN junction rectifiers and MOSFETs. However, semiconductor wafers that are thinned to 25 μm would be extremely difficult to manufacture.

A new technology of Deep Reactive Ion Etch has been recently been developed. Semiconductor processing tools utilizing this technology can achieve etching rates of 10 μm per minute with trench aspect ratio approaching 100:1. Thus, deep, relatively narrow (5-20 μm wide) trenches can be etched entirely through the thickness of a semiconductor wafer. This technology has been used for microelectromechanical systems (MEMS) such as microsensors and microactuators However, for the application to power devices as described in this disclosure, only a partial etch through the thickness of the wafer is used.

OBJECTS OF THE INVENTION

It is an object of this invention to provide a process for producing vertical conducting power devices where the semiconductor wafers have been thinned to semiconductor thickness ranging from 10 μm thick to 200 μm.

It is a further object of this invention to provide vertical conducting power devices having significantly reduced substrate resistance which provides improved forward voltage.

It is a further object of this invention to provide vertical conducting power devices having significantly reduced thermal impedance of the substrate so at to obtain acceptable operating temperatures for high power devices.

It is a further object of this invention to provide vertical conducting power devices having reduced fabrication cost through the use of low doping concentration float zone wafers in one embodiment rather using the expensive growth of thick epitaxial layers on heavily-doped substrates.

It is a further object of this invention to provide vertical conducting power devices having low doping concentration float zone wafers so that P and N doping regions can be defined at the backside of the wafer to implement specialized structures such as anode shorts, cathode shorts, and defined emitter area.

It is a further object of this invention to provide vertical conducting power devices having low doping concentration float zone wafers so that localized lifetime killing near the backside interface of the device can also be obtained using high energy proton and He implants in thinned semiconductor devices.

It is a further object of this invention to provide vertical conducting power devices having reduced wafer warpage and wafer breakage in the manufacturing environment and a compatibility with automated handling.

These and further objects of the invention will become apparent as the description of the invention proceeds.

SUMMARY OF THE INVENTION

Semiconductor substrates suitable for making thin vertical current conducting devices can be made by providing a relatively thick semiconducting substrate with at least one conductivity type having a thickness of from about 100 μm to 700 μm and having a first side and a second opposite side. At least one active device region on the first side of the relatively thick substrate can be initially optionally formed. The key feature is to next thin the semiconducting substrate in at least one selected region on the second side below at least partially where the active device will be on the first side so as to have the selected region thinned to a thickness ranging from about 10 μm to 400 μm to form at least one deep trench. When the substrate has more than one conductivity type layers or more than one conductivity type layer concentrations the depth of the thinning of the semiconducting substrate is controlled so that either (a) some of the first thinned conductivity type layer or some of the first thinned conductivity type layer concentration remains or (b) the thinning proceeds all the way through the first conductivity type layer or all the way through the first conductivity type layer concentration. Next a conductivity type dopant can be optionally formed in the semiconductor substrate in the thinned selected region on the second side. A current electrode is formed on the second side in contact with the thinned selected region or the conductivity type dopant in the thinned selected region. Finally, at least one active device region is formed on the first side of the relatively thick substrate if it was not formed during the prior optional forming operation.

The selected region can be thinned to a thickness ranging from 10 μm to 200 μm. The thinning can be done by etching or laser drilling. Examples of etching include deep RIE, chemical etching, anisotropic chemical etching, $XeF_2$ gas etching, plasma etching, and isotropic plasma etching. The conductivity type of the substrate will be either a P conductivity type or an N conductivity type.

The active device region can be made by forming at least one conductivity type dopant in the relatively thick substrate on the first side and forming a current electrode in contact with at least one conductivity type dopant in the thick substrate on the first side. The active device region formed on the first side can be a source or a drain and it can have a gate electrode with a preferred example being a field effect transistor electrode.

Various methods can be used for thinning the second side. The semiconductor substrate can have a unique peripheral geometry so that each substrate can be maintained in the same orientation in the thinning device. When the deep trenches are produced by the thinning device they will be in the same registry with the active device region on the first side for each semiconductor substrate. A second technique is to have the deep trenches aligned to the active device regions on the first side. When there are more than one active device regions on the first side the deep trenches can be aligned to the active device regions to leave thick regions or ribs of support on the second side located between each pair of active device regions on the first side. The pattern of the series of deep trenches from the second side can be formed in a contiguous pattern or in a non-contiguous pattern such as a checkerboard pattern to provide increased substrate mechanical strength.

The relatively thick semiconductor substrate can be made by float zone production or by wafer bonding. The substrate can be made of at least two layers having different conductivity dopant concentrations or conductivity dopant types and one of the layers can be made by epitaxial growth.

Devices made by these methods include, for example, a vertical current MOSFET, a vertical current high voltage MOSFET, a vertical current IGBT, and high and low voltage diodes. These thinning methods result in new physically strong thin vertical current conducting devices. The devices can be made of a relatively thick semiconducting substrate with at least one conductivity type having a thickness of from about 100 µm to 700 µm. There is at least one active device region on the first side of the substrate. On the second side below the active device on the first side there can be at least one thinned selected region which has been thinned to a thickness ranging from about 10 µm to 400 µm to form at least one deep trench. The device can optionally contain a conductivity type dopant in the semiconductor substrate in the thinned selected region on the second side. A current electrode on the second side is in contact with the thinned selected region or the conductivity type dopant in the thinned selected region. As a result the device has physical stability in the regions of the remaining relatively thick substrate and in the thinned region below the active device vertical current can more readily conduct to provide improved electrical properties.

In an embodiment where the substrate has more than one conductivity type layers or more than one conductivity type layer concentrations, then the depth of thinning can be controlled so that either (a) some of the first thinned substrate layer remains or (b) the thinning has been performed all the way through the first layer or the first layer concentration.

The deep trenches can be aligned to the active device regions on the first side by at least two preferred techniques. One is to first photoimage the active devices on the first side and then photoimage the areas to be thinned on the second side in registery with the photoimaging on the first side by using photolithographic alignment techniques. The other technique is to form the active device regions on the first side in registery with the peripheral geometry of the semiconductor substrate and then form trenches on the second side by registering the peripheral geometry of the semiconductor substrate so that it is registered to the first side.

DESCRIPTION OF THE PREFERRED EMBODIMENTS

Figure 1:
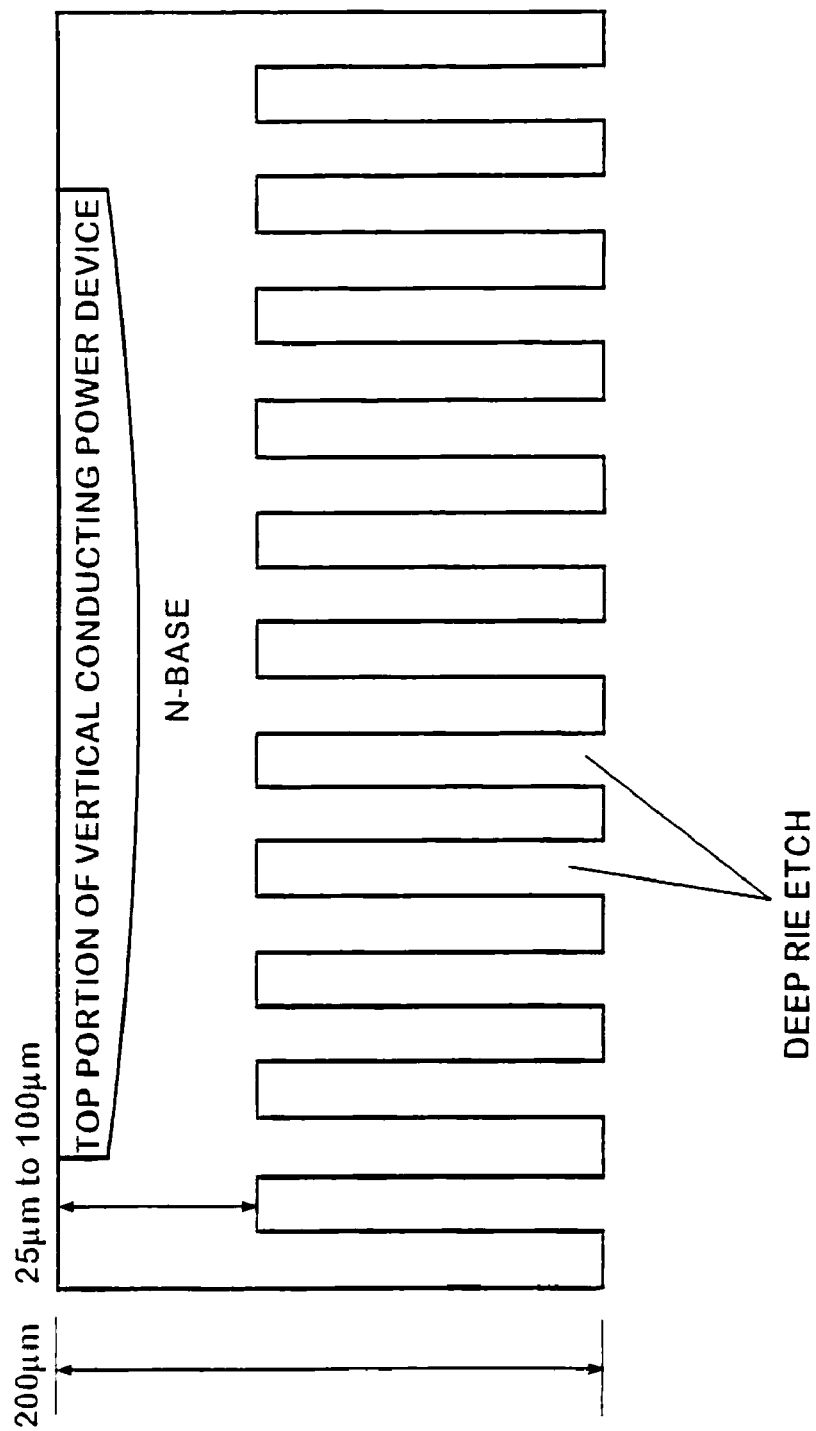
FIG. 1 illustrates a cross section of a vertical conducting power device according to Approach 1 where there is no alignment of the deep etch, uniform, non-contiguous pattern from the backside to the active device region on the front of the surface.
Figure 4:
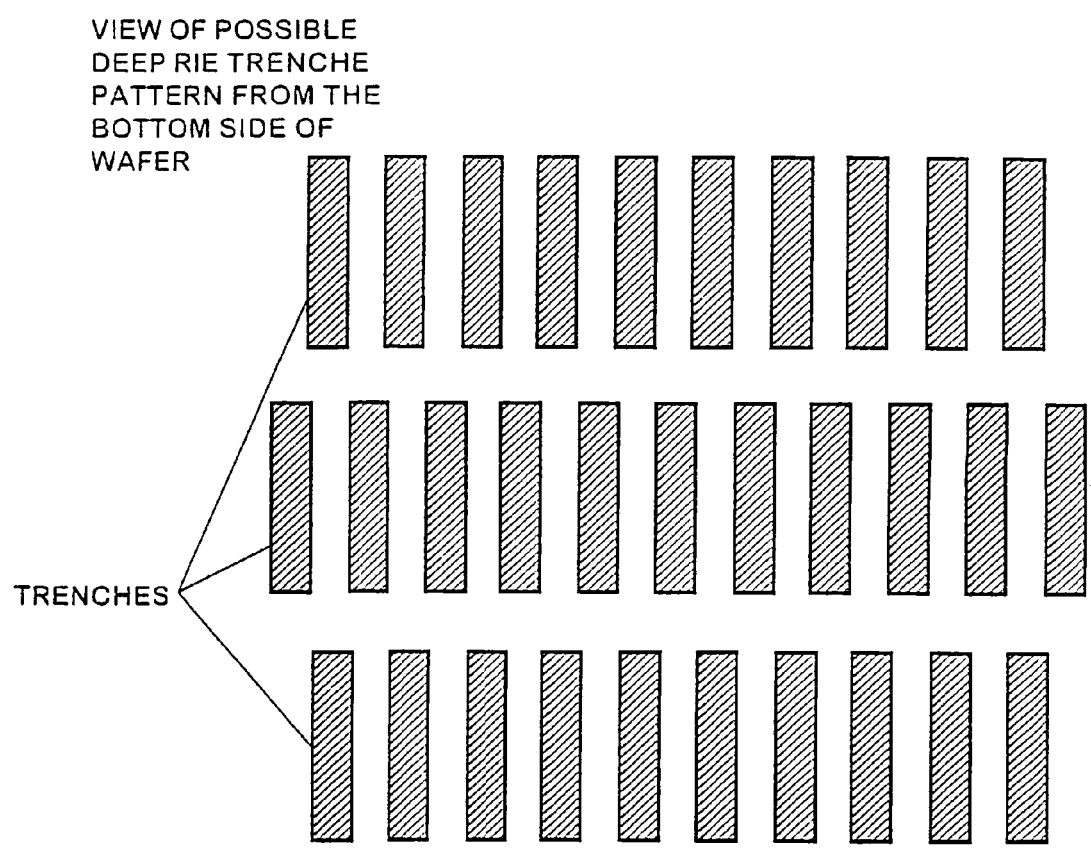
FIG. 4 illustrates a backside view of a possible pattern of deep, possibly non-contiguous, uniform deep etch trenches as described in Approach 1.

Thinned wafers can be obtained using thick (100 µm to 700 µm) semiconductor wafers that are thinned from the backside (or potentially front side) only in selected regions. Several attractive approaches to define the areas where the deep etching will occur (among a number of different approaches) are as follows. First, there is "Approach 1" where there is no alignment of the deep etch, uniform pattern on the backside to the active device region on the front of the surface as shown in FIG. 1. In addition to the contiguous array of deep etches illustrated in FIG. 1, it is also possible to have non-contiguous arrays as illustrated in FIG. 4. A preferred way to provide overall registry of the deep trenches with the top side is to use a semiconductor substrate which has a unique peripheral geometry so that each substrate can be maintained in the same orientation in the photoexposure alignment tool which is used to register the trench location with the flat or notch of the semiconductor substrate. Examples of such geometries include having a flat side portion on a generally round wafer or having a notch in the side of the wafer. The wafer will always fit in the thinning device in the same orientation and as a result the deep trenches produced by the thinning device are in the same registry with the active device region on the first side for each semiconductor substrate. Another way to provide the registry is to photoimage the active devices on the first side and then photoimage the areas to be thinned on the second side in registery with the first photoimaging on the first side using photolithographic alignment techniques.

Figure 2:
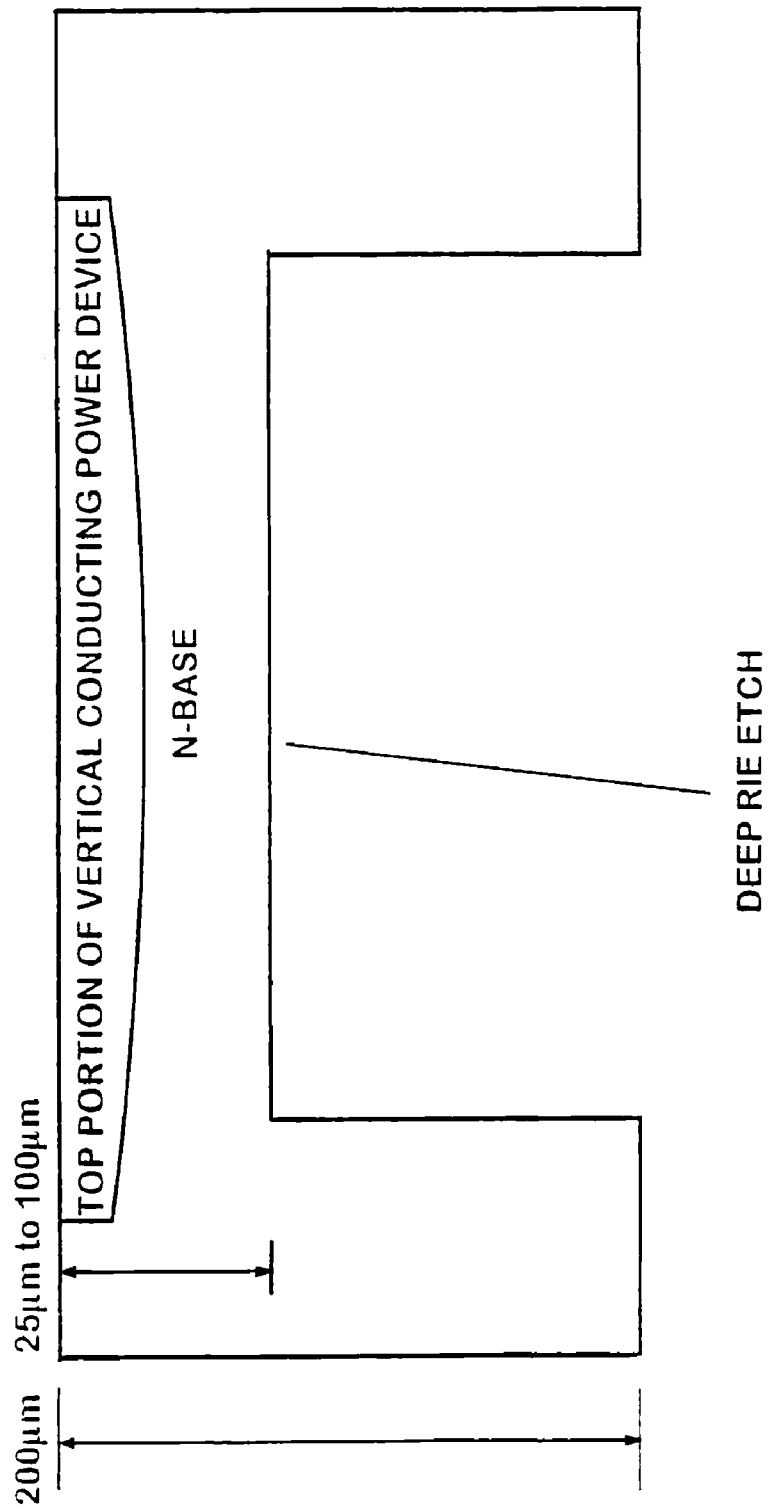
FIG. 2 illustrates a cross section of a vertical conducting power device according to Approach 2 where the deep etch from the backside is aligned to the active device region on the front side of the wafer.

In "Approach 2" the deep etch from the backside is aligned to the active device region on the front side of the wafer as shown in FIG. 2.

Figure 3:
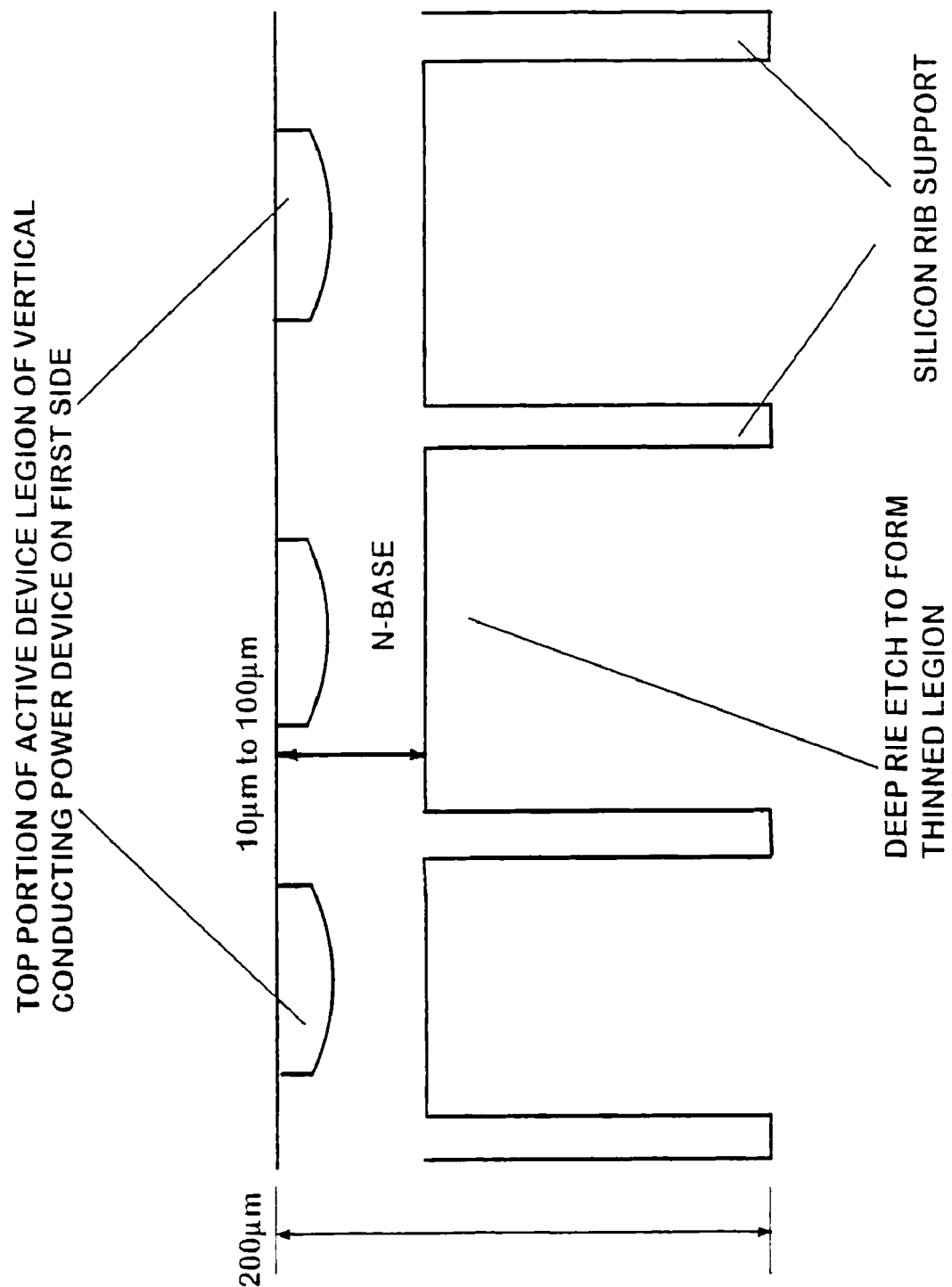
FIG. 3 illustrates a cross section according to Approach 3 of an IGBT where there is an alignment of the deep etch to the front side of the wafer so that the deep etch leaves ribs of support on the backside in regions between two devices on the front side of the wafer.

Finally, in "Approach 3" there is an alignment of the deep etch to the front side of the wafer so that the deep etch leaves a rib of support on the backside in regions between each pair of devices on the front side of the wafer as shown in FIG. 3.

For Approach 2 above, the deep etch from the backside is aligned to the active device region on the front side of the wafer where the vertical current transports from the front to the backside. Much of the front surface area of a high voltage power device is utilized to implement structures (such as floating diffusion rings and junction termination extension) that surround the active device to provide field termination for the power device to obtain high breakdown voltage. Thus, there generally will be no need of a deep etch under these surrounding areas and as a result there will be significant mechanical strength to the wafer. Thus, the area of the active device may be less than 50 percent of the total surface area. For Approach 2 the mechanical strength of the thicker portion of the semiconductor wafer will not be reduced significantly by thinning in selected areas from the backside that are aligned to the active device regions on the front side of the semiconductor wafer. Also, for Approach 1 and Approach 3 discussed above, improved mechanical strength is obtained for the wafer compared to a uniformly thinned wafer. From a cost of manufacturing point of view Approach 1 above where there is no alignment to the device on the front side of the wafer may be the easiest to implement and may be the lowest cost, assuming no degradation in breakage rate.

A backside view of a possible deep, possibly non-contiguous, uniform deep etch pattern as describe in Approach 1 is shown in FIG. 4 which is designated herein as a checkerboard pattern. This is only one of a number of possible patterns. In general, the patterns are chosen to maximize semiconductor wafer strength with the constraint of optimizing device performance. The semiconductor wafer should have increased strength by choosing a non-contiguous pattern. If all of the trenches shown in FIG. 4 were aligned vertically, then it will be easier for a break in the wafer to occur along that vertical line. The arrangement in FIG. 4, on the other hand, with its non-contiguous array does not have the vertical alignment of all of the trenches since between every other row there is a solid row of the wafer material.

There are significant performance advantages for implementing power devices on semiconductor wafers that have been thinned to semiconductor thickness ranging from about 10 μm thick to 400 μm and preferably from 10 μm to 200 μm. Some of the major advantages are significantly reduced substrate resistance which provides improved forward voltage, significantly reduce thermal impedance of the substrate which is of key importance for obtaining acceptable operating temperatures for high power devices, and reduced fabrication cost through the use of low doping concentration float zone wafers rather than the alternate approach of utilizing the expensive growth of thick epitaxial layers on heavily-doped substrates. Other key advantages for implementing power devices by thinning, rather than the alternative approach of utilizing thick epitaxially layer growth, is that P and N doping regions can be defined at the backside of the wafer to implement specialized structures such as anode shorts, cathode shorts, and defined emitter area. Localized lifetime killing (reduced minority carrier recombination times) near the backside interface of the device can also be obtained using high energy proton and He implants in thinned semiconductor devices.

Fragile thinned semiconductor power devices wafers are difficult to fabricate in a manufacturing environment because of wafer warpage, wafer breakage, and incompatibility with automated handling. The present method of manufacture overcomes these known fabrication problems.

Having described the basic aspects of the invention, the following examples are given to illustrate specific embodiments thereof.

The first group of Examples 1-6 relate to low doping concentration float zone wafer approaches.

EXAMPLE 1

Figure 5A:
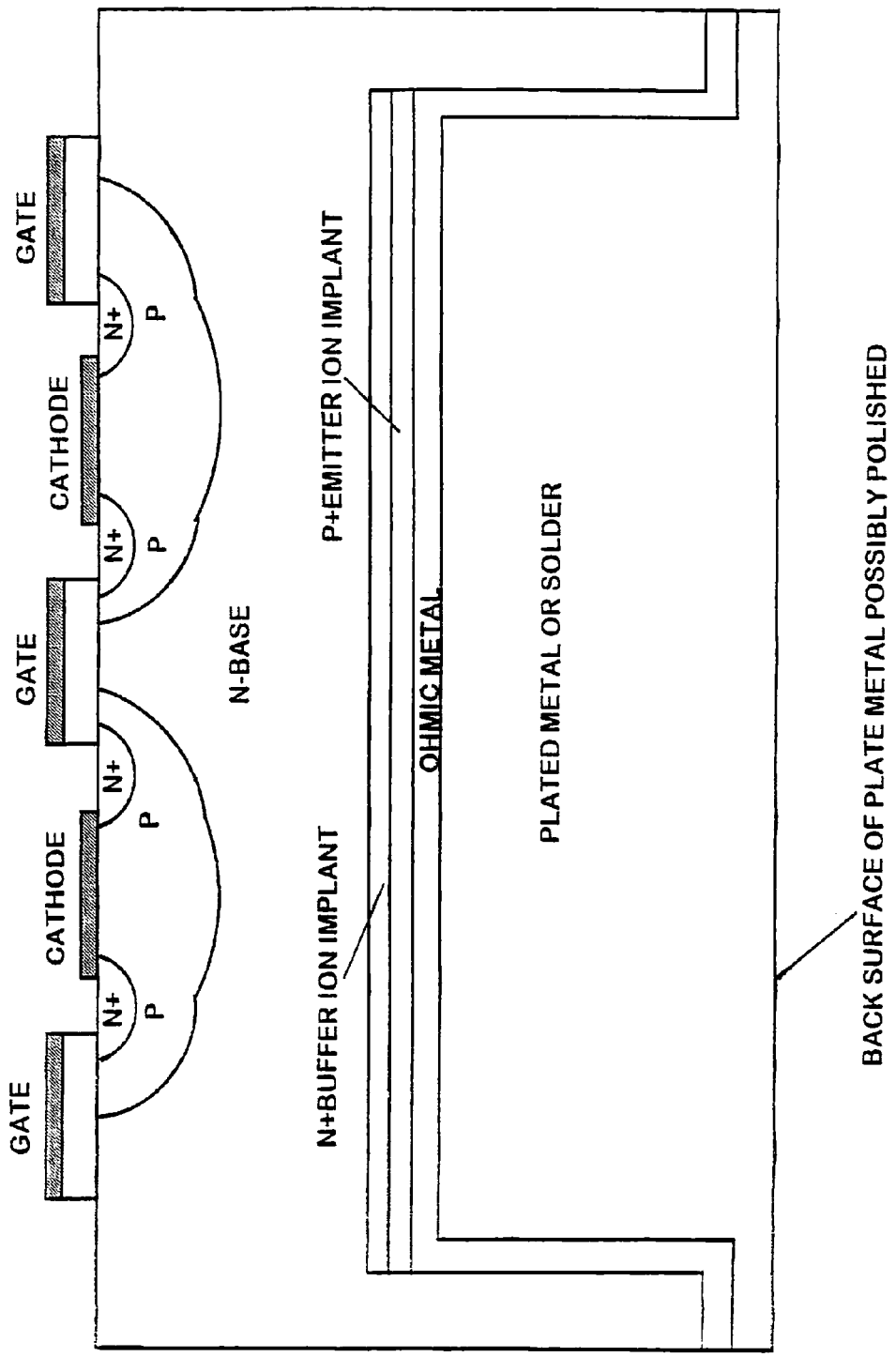
FIG. 5a illustrates a cross section of an deep etched IGBT that has P+ emitter ion implant and a N+ doubly ionized phosphorous ion implant into back surface of a deep trench etch.

This example produces a deep etched IGBT in about 200 μm thick float zone semiconductor wafer and is illustrated in FIG. 5a.

To readily identify the many steps involved with the manufacturing process, they are set forth in numbered paragraphs.

1. Provide an N+ float zone wafer.
2. Perform processing step to implement active devices generally consisting of MOSFETs, diffusions, dielectrics, and field termination regions, etc. on the front (cathode) side of the device.
3. Thin semiconductor wafer from the backside using grinding and etching to a thickness of approximately 200 μm.
4. Photolithography define areas for deep etching on the backside of the wafer using Approach 1 to Approach 3 above. For Approach 1 above, no alignment is necessary so that a glass plate with patterns can be placed on the back and used to expose the resist.

An even less expensive method to define the regions for the deep RIE etch may be to put a wire mesh (with 20 μm wide wires and 20 μm wide spaces) over the back surface and use this as a mask for deep RIE etching so that a photolithography step is not necessary.

5. Etch 100 μm deep trench from the back side by using, for example, a Bosch deep RIE. Possibly use a chemical clean up etch after deep RIE to remove polymers and heavy metals.
6. Boron implant dose in the range of $1 \times 10^{15}$ cm$^{-2}$ to $1 \times 10^{16}$ cm$^{-2}$ to form the P+ anode emitter for non-punch through IGBT with possibly additional step of high energy doubly ionized phosphorous implant to form N+ buffer for a punch through IGBT.
7. Optional step for excimer laser annealing to activate ion implanted dopant.
8. Deposit an ohmic contact metal which is typically 0.5 to 1 μm metal.
9. Anneal metal and partially activate ion implanted dopant in a temperature range of 400° C. to 500° C.
10. Possibly plate metal or solder (possibly followed by a polishing step) to increase the strength of the wafer and make contact to the metal in the trench. This also provides a thermoconductive layer to heat generated in the active device region.

When the P conductivity type implant is controlled to be a low doped, thin P type implant then it functions as a transparent emitter to allow for the transport of electrons through the transparent emitter to the metal contact. Transparent emitters are discussed in U.S. Pat. No. 5,668,385 where a transparent emitter is said to be understood to be an anode-side emitter layer which is structured in such a manner that a significant proportion of the total current leaves the anode metallization of the component as electron current. This electron current specified in % of the total current is called emitter transparency. The patent states that the emitter transparency can be adjusted within wide limits by means of depth and edge concentration of the p+-type anode emitter. p+-type anode emitters having a transparency of 50% and more are said to be of technical significance.

The same processing steps on the backside of a wafer can be used to make a MOS Controlled Thyristor (MCT) except that the processing on the front side of a wafer is that for a MCT.

EXAMPLE 2

This example produces a deep etched IGBT in about 400 μm thick float zone semiconductor wafer with 800° C.-900° C. implant anneal and is illustrated in FIG. 5a.

A 400 μm-600 μm thick semiconductor wafer is sufficiently strong so that standard processing step such as photolithography can be performed on the wafer. Thus, it an attractive approach is to perform the processing steps for an IGBT to just before metal deposition, perform a 300 μm deep etch (100 μm effective semiconductor thickness remaining), ion implant the shallow P+ emitter and deeper doubly ionized N+ buffer ion doping, and then anneal at 900° C. to fully activate the ion implanted dopant. In the approach described in Example 1 above, the ion implanted dopant is only partially activated since an anneal temperature of less than 500° C. was used. After performing the 900° C. anneal step, processing steps to deposit metal, photolithographically define metal, deposit passivation dielectrics, define vias, and etch on the front side of the wafer can be performed. Also, metal deposition, plating, and possibly solder on the backside of the wafer are performed.

The same processing steps can be used to make a MOS Controlled Thyristor (MCT) on a 400 μm thick wafer except that the processing on the front side of a wafer on the front side of a wafer is that for a MCT.

EXAMPLE 3

Figure 5B:
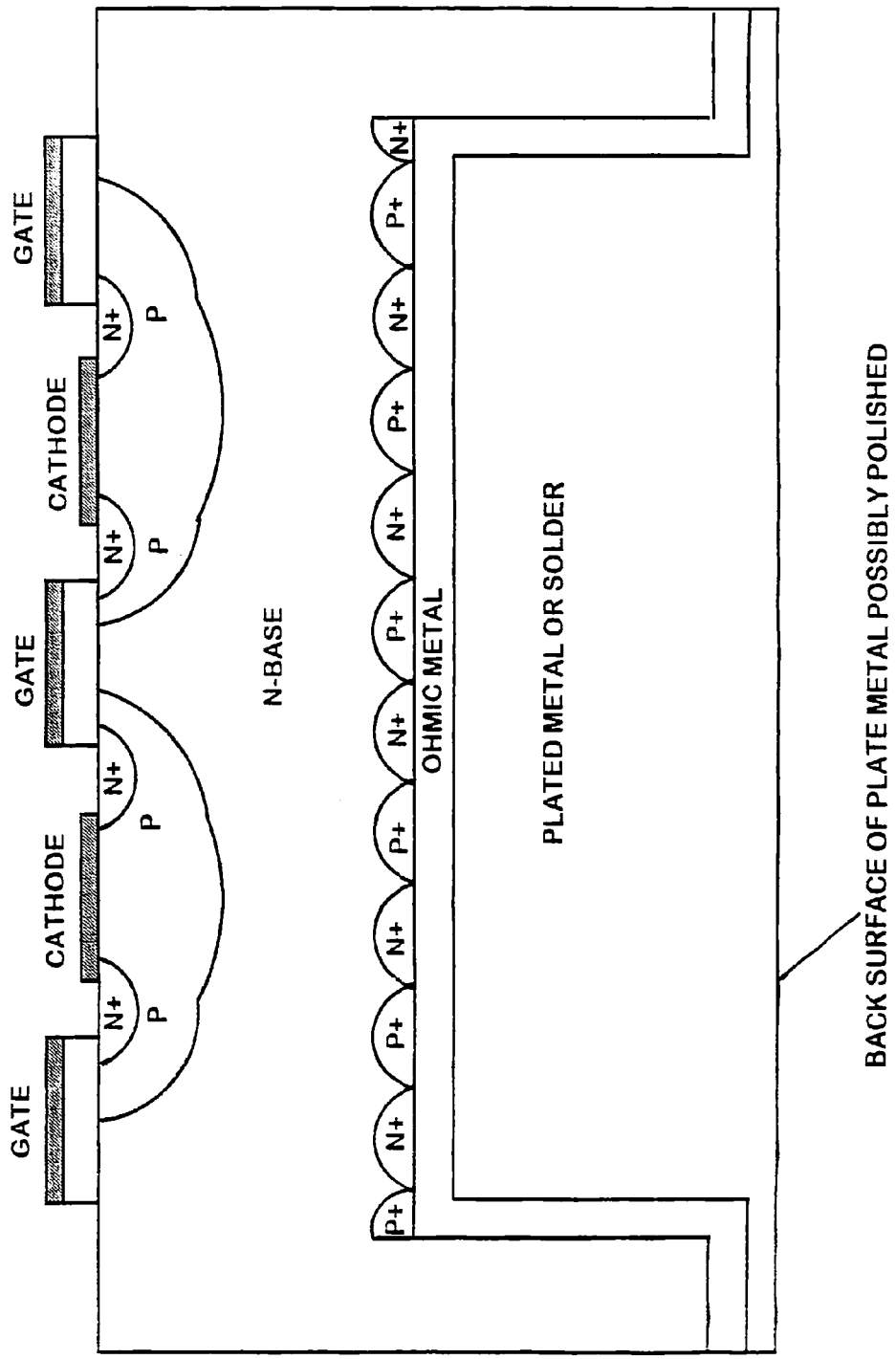
FIG. 5b illustrates a cross section of an deep etched IGBT that has N+ and P+ regions at the anode back side surface to implement MOSFET in parallel with an IGBT to obtain improved characteristics.

This example produces a deep etched IGBT in about 200 μm thick float zone semiconductor wafer that has a MOSFET in parallel with the IGBT implemented by N+ and P+ doping regions at the backside of the device and is illustrated in FIG. 5b.

1. Provide an N− float zone wafer that is 200 μm or thicker.

2. Perform processing step to implement active devices generally consisting of MOSFETs, diffusion and field termination regions on the front (cathode) side of the device.

3. Thin semiconductor wafer from the backside using grinding and etching to a thickness of approximately 200 μm.

4. Photolithography define areas for deep etching on the backside of the wafer using Approach 2 or Approach 3 above.

5. Etch 100 μm deep trench from the back side. Possibly use a chemical clean-up etch after deep RIE.

6. Blanket implant boron implant dose in the range of $1.\times10^{15}$ cm$^{-2}$ to $1.\times10^{16}$ cm$^{-2}$ to form the P+ anode emitter for non-punch through IGBT with possibly additional step of a deeper doubly ionized phosphorous implant to from N+ buffer for a punch through IGBT.

7. Define regions for N+ implant on the back side of the deep trench. The typical way to define the pattern for the N+ implant would be to use photolithography. However, the wafers are still fragile at 200 μm thick. Thus, it may be possibly to place a metal mesh (with approximately 20 μm wide wires and 20 μm wide spaces) on the back of the wafer and use that to define the regions for the N+ implant. It is in general not necessary to align the N+ implant pattern to the front side, thus a photolithography approach in which a patterned metallized glass plate is put on the back of the wafer to define resist may be sufficient. It may be necessary to use a lithography procedure such as X-ray lithography that has a large depth of focus to define the N+ regions in the bottom of the trench. For low temperature anneals after the ion implant, on a small percentage of the boron ion implanted dopants are activated whereas N+ dopant atoms have a higher percentage of activation, thus the N+ implant doping overcompensates the P+ doping.

8. Optional step for excimer laser annealing to activate ion implanted dopant.

9. Deposit metal.

10. Anneal metal and partially activate ion implanted dopant in a temperature range of 400° C. to 500° C.

11. Possibly plate metal or solder (possibly followed by a polishing step) to increase the strength of the wafer and make contact to the metal in the trench.

The same processing steps on the backside of a wafer can be used to make a N-MOS Controlled Thyristor (MCT) except that the processing on the front side of a wafer is selected to make a MCT.

EXAMPLE 4

This example produces 25 μm effective thickness rectifier made using deep etched in about 200 μm thick float zone semiconductor wafer.

1. Provide an N− float zone wafer.

2. Perform processing step to implement active devices diffusion and field termination regions on the front (cathode) side of the device.

3. Thin semiconductor wafer from the backside using grinding and etching to a thickness of approximately 200 μm.

4. Photolithography define areas for deep etching on the backside of the wafer.

5. Etch 175 μm deep trench from the back side (semiconductor thickness of about 25 μm remaining). Possibly use a chemical clean-up etch after deep RIE.

6. Ion phosphorous N-type dopant with a dose of $5.\times10^{25}$ cm$^{-2}$ to form N+ backside contact.

7. Optional step for excimer laser annealing to activate ion implanted dopant.

8. Deposit metal.

9. Anneal metal and partially activate ion implanted dopant in a temperature range of 400° C. to 500° C.

10. Possibly plate metal or solder (possibly followed by a polishing step) to increase the strength of the wafer and make contact to the metal in the trench.

EXAMPLE 5

Figure 6A:
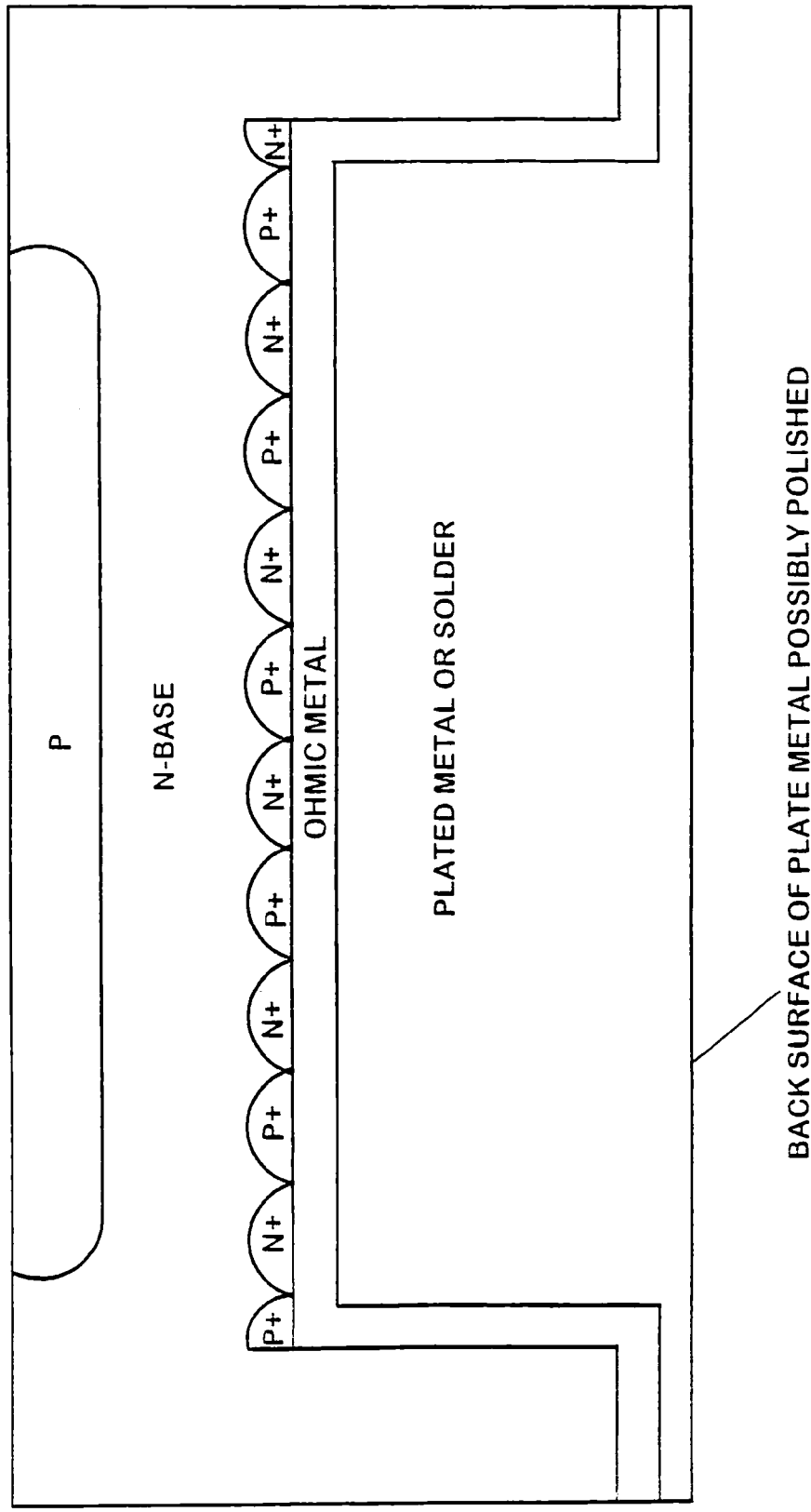
FIGS. 6a and 6b illustrate a 25 µm effective thickness rectifier made using deep etched in about 200 µm thick float zone semiconductor wafer that has N+, P+, or Schottky metal contact at the backside to make ideal ohmic contact.
Figure 6B:
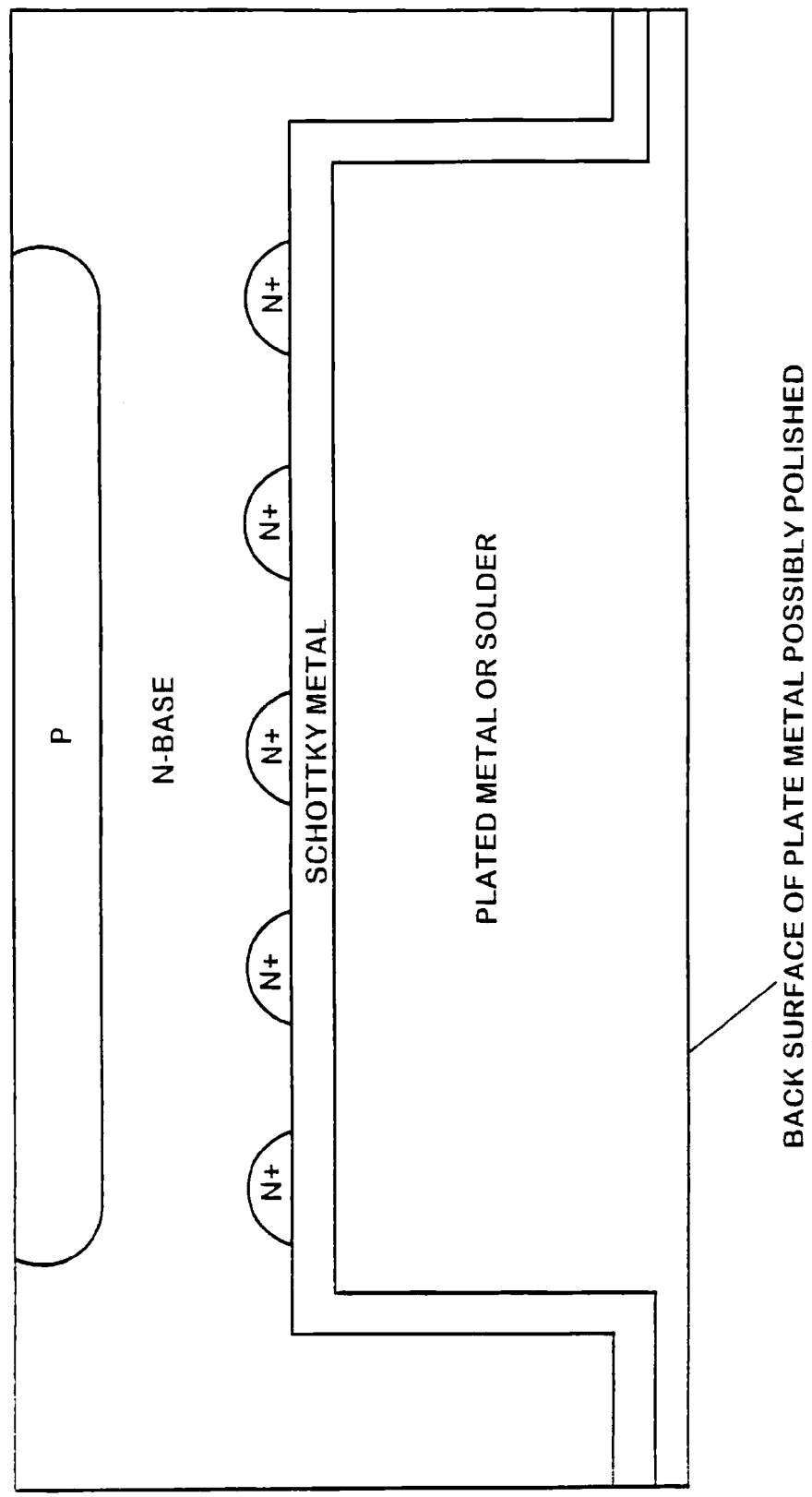

This example produces 25 μm effective thickness rectifier made using deep etched in about 200 μm thick float zone semiconductor wafer that has an ohmic contact to N+ or P+ dopant regions or a Schottky contact (which is not an ohmic contact but is rectifying) to a low doped concentration region at the backside to enhance the flow of hole minority carriers to the backside during turn off as illustrated in FIG. 6a or 6b.

The procedure in this example is similar to Example 4 above, except that in addition to the N+ on the backside of the N− base layer there is an additional P+ or Schottky contact to the backside of the N− base layer. A continuous N+ layer as in Example 4 will block hole flow to the backside metal contacts during turnoff. By providing these alternating P+ or Schottky contacts it provides for hole flow to the backside metal contact during turnoff which provides for faster turn off for the device if the holes can flow to the backside. See B. Jayant Baliga, "Power Semiconductor Devices" PWS Publishing Company. Boston. Mass., pp. 178-181, 1996.

1. Provide an N− float zone wafer.
2. Perform processing step to implement active devices diffusion and field termination regions on the front (cathode) side of the device.
3. Thin semiconductor wafer from the backside using grinding and etching to a thickness of approximately 200 μm.
4. Photolithography define areas for deep etching on the backside of the wafer using Approach 2 or Approach 3 above.
5. Etch 175 μm deep trench from the back side (semiconductor thickness of about 25 μm remaining). Possibly use a chemical clean-up etch after deep RIE.
6. Blanket implant boron implant dose in the range of $1 \times 10^5$ cm$^{-2}$ to $1 \times 10^6$ cm$^{-2}$ from the P+ region.
7. Define regions for N+ implant on the back side of the deep trench. The typical way to define the pattern for the N+ implant would be to use photolithography. However, the wafers are still fragile at 200 μm thick. Thus, it may be possibly to place a metal mesh (with approximately 20 μm wide wires and 20 μm wide spaces) on the back of the wafer and use that to define the regions for the N+ implant. It is in general not necessary to align the N+ implant pattern to the front side, thus a photolithography approach in which a patterned metallized glass plate is put on the back of the wafer to define resist may be sufficient. It may be necessary to use a lithography procedure such as X-ray lithography that has a large depth of focus to define the N+ regions in the bottom of the trench.
8. Ion phosphorous n-type dopant with a dose of about $5 \times 10^{15}$ cm$^{-2}$ to form N+ backside contact. The N+ doping will overcompensate the activated boron doping. For low temperature anneals after the ion implant, there will be a small percentage of the boron ion implanted P+ dopants activated whereas the N+ dopant atoms have a higher percentage of activation, and thus the N+ implant doping overcompensates the P+ doping.
9. Optional step for excimer laser annealing to activate ion implanted dopant.
10. Deposit metal.
11. Anneal metal and partially activate ion implanted dopant in a temperature range of 400 C. to 500 C.
12. Possibly plate metal or solder (possibly followed by a polishing step) to increase the strength of the wafer and make contact to the metal in the trench.

A region with Schottky contacts and N+ doped regions as illustrated in FIG. 6b can be made by not performing the blanket boron implant which forms the P+ doped region.

EXAMPLE 6

This example produces a 25 μm-50 μm effective thickness MOSFET made using deep etched in about 200 μm thick float zone semiconductor wafer.

The backside processing steps for this power MOSFET devices are the same as for the deep etch IGBT described in Example 3 above, except the backside has N+ dopant implanted and not a P+ dopant. Power MOSFETs generally have low concentration drift thickness ranging from 25 μm to 100 μm. Thus etching is done to this thickness to obtain the desired thickness. The advantage of using deep RIE is that there is a reduction in substrate resistance, and secondly, improved thermal conductance.

The second group of Examples 7-11 relate to epitaxial growth and wafer bonding approaches. In these devices the relatively thick semiconductor substrate is made of at least two layers having different conductivity dopant concentrations or conductivity dopant types.

There are advantages to using the above described float zone wafers in terms of reduced cost for the substrate. However, alternate methods can be used to perform the deep etching on substrates that have epitaxial layers or are made by direct wafer bonding. These etching methods include deep RIE, chemical etching, anisotropic chemical etching, $XeF_2$ gas etching, plasma etching, and isotropic plasma etching.

The deep etching approach can be combined with epitaxial growth or wafer bonding approaches to achieve unique structures at the backside of the device such as ideal ohmic contact for PIN rectifiers, see B. Jayant Baliga, "Power Semiconductor Devices" PWS Publishing Company, Boston, Mass., pp. 178-181. 1996, or anode shorts for IGBTs, see B. Jayant Baliga. "Power Semiconductor Devices" PWS Publishing Company, Boston, Mass., pp. 316, 1996, or MCTs. An example is an IGBT that has a MOSFET in parallel with an IGBT to obtain improved characteristics as shown in FIG. 5. In these cases, there will generally be a low doped N− base layer (that is implemented by epitaxial growth or wafer bonding) on either a P+ or N+ substrate.

EXAMPLE 7

Figure 7A:
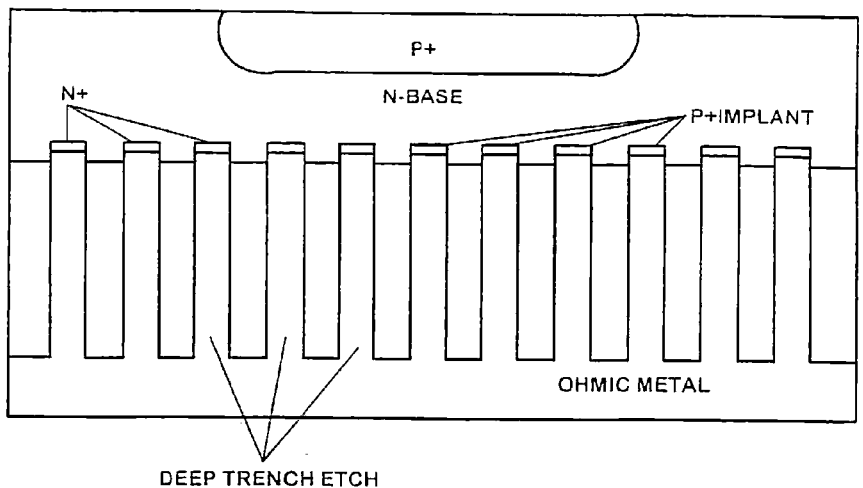
FIGS. 7a, 7b, and 7c illustrate a PIN rectifier with ideal ohmic contact at the backside (cathode side) made with N+ base on N+ substrate and/or N+ base on P+ substrate.

This example produces a PIN rectifier with ideal ohmic contact at the backside (cathode side) made with N− base epitaxial layer on N+ substrate and is illustrated in FIG. 7a.

1. Form an N− layer on an N+ region by (a) epitaxially growing 25 μm thick N− base layer (with potentially an N layer) on N+ substrate or (b) wafer bond am N− wafer to an N+ substrate and thin the N− to 25 μm.
2. Perform processing step to implement active devices diffusion and field termination regions on the front (cathode) side of the device.
3. Thin semiconductor wafer from the backside using grinding and etching to a thickness of approximately 200 μm.
4. Photolithography define areas for deep etching on the backside of the wafer.
5. Etch 175 μm deep trench from the back side so that have completely etched through the N+ substrate and are into the N− base layer (semiconductor thickness of about 25 μm remaining). Possibly do a chemical clean up etch.
6. Ion implant boron ions to a dose of $5\text{-}10 \times 10^{15}$ cm$^{-2}$ to make a P+ junction on the bottom of the deep etched trenches.
7. Optional step for excimer laser annealing to activate ion implanted dopant.
8. Deposit metal.
9. Anneal metal and partially activate ion implanted dopant in a temperature range of 400° C. to 500° C.

10. Possibly plate metal or solder (possibly followed by a polishing step) to increase the strength of the wafer and make contact to the metal in the trench.

This PIN rectifier thus has P+ region for collecting holes, and N+ regions for collecting electrons at the back side of the device. Since the holes that are stored in the base can be collected by the top side P+ emitter and backside P+ junction, this device will have significantly faster turn-off time compared to a rectifier where holes can flow out of the device only through the front side.

EXAMPLE 8

Figure 7B:
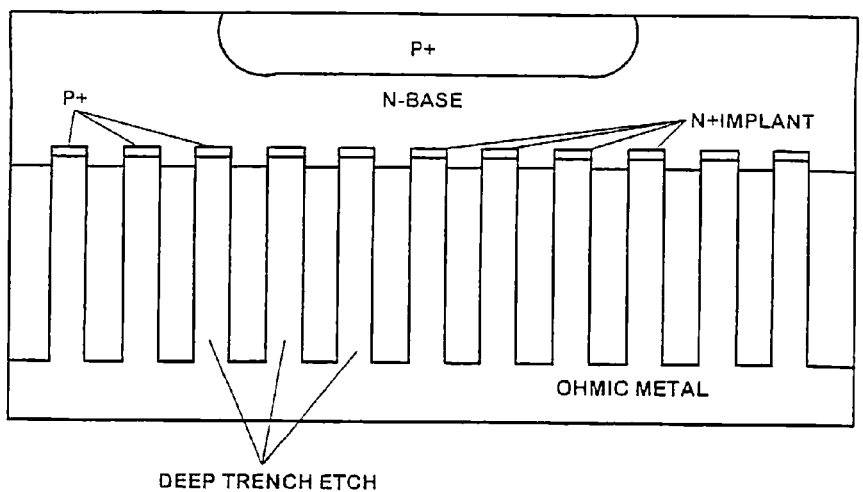

This example produces a PIN rectifier with ideal ohmic contact at the backside (cathode side) made with N− base layer on P+ substrate and is illustrated in FIG. 7b.

This stricture is very similar to the device shown in FIG. 7a, except that a P+ substrate is used. It is necessary that the deep RIE etch go completely through the P+ layer and then N+ dopant atoms are ion implanted into the bottom of the deep trenches.

EXAMPLE 9

Figure 7C:
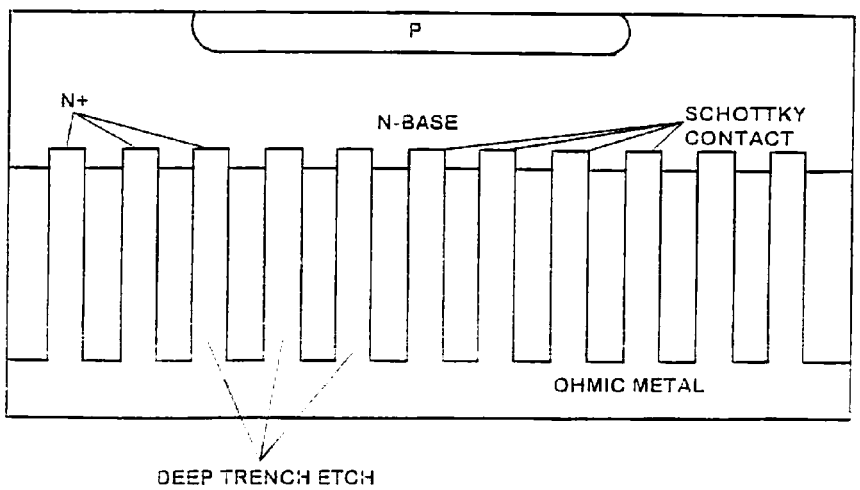

This example produces a PIN rectifier with parallel Schottky contact at the backside (cathode side) made with N− base on N+ substrate and is illustrated in FIG. 7c.

This structure is identical to the device shown in FIG. 7a, except that a Schottky contact is made at the back surface to collect holes stored in the base during device turn-off. In this example an N− layer is grown on a N+ substrate.

EXAMPLE 10

This example produces a deep etched IGBT in about 200 μm N− base layer on N+ or P+ that has a MOSFET in parallel with the IGBT implement by N+ and P+ doping regions at the backside of the device and is illustrated in FIG. 8.

These IGBT structures with N+ and P+ doping regions at the backside (anode) of the IGBT can be made in the same manner as described for the PIN rectifiers with N+ and P+ doped regions on the backside of the device as described in Examples 7-9 above.

Figure 8A:
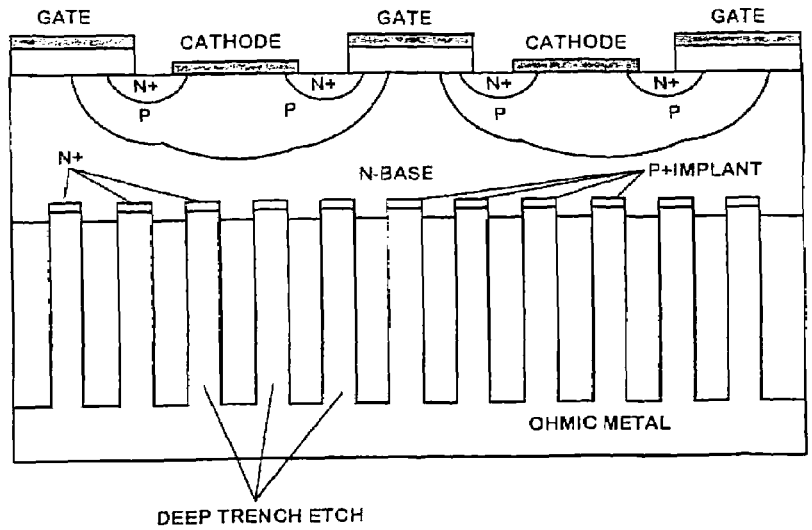
FIGS. 8a, 8b and 8c illustrate a deep etched IGBT in about 200 µm thick float zone semiconductor wafer that has a MOSFET in parallel with the IGBT implemented by N+ and P+ doping regions at the backside of the device.
Figure 8B:
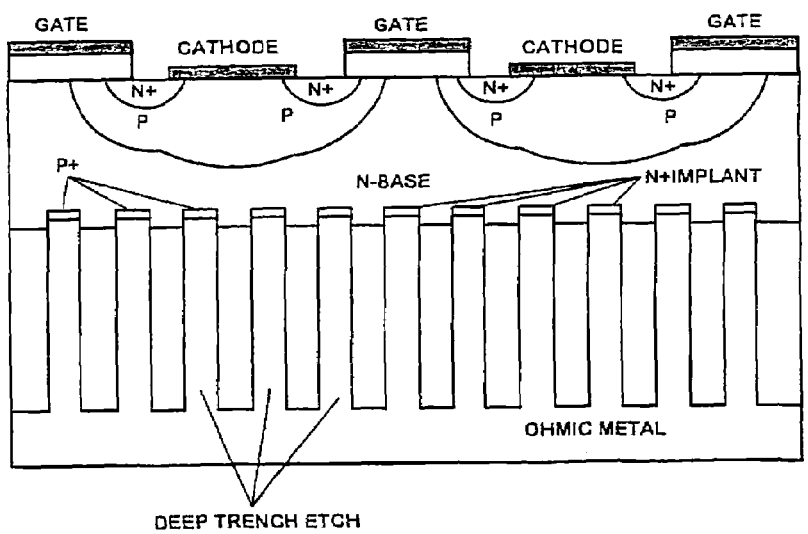
Figure 8C:
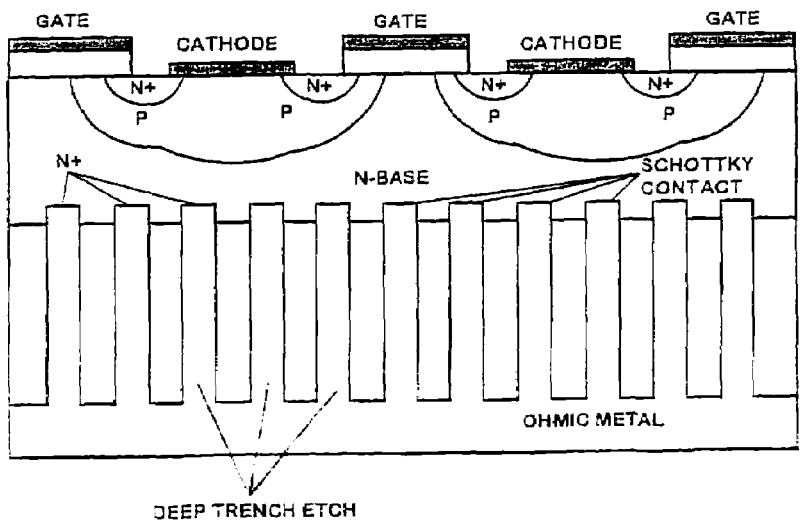
Figure 9:
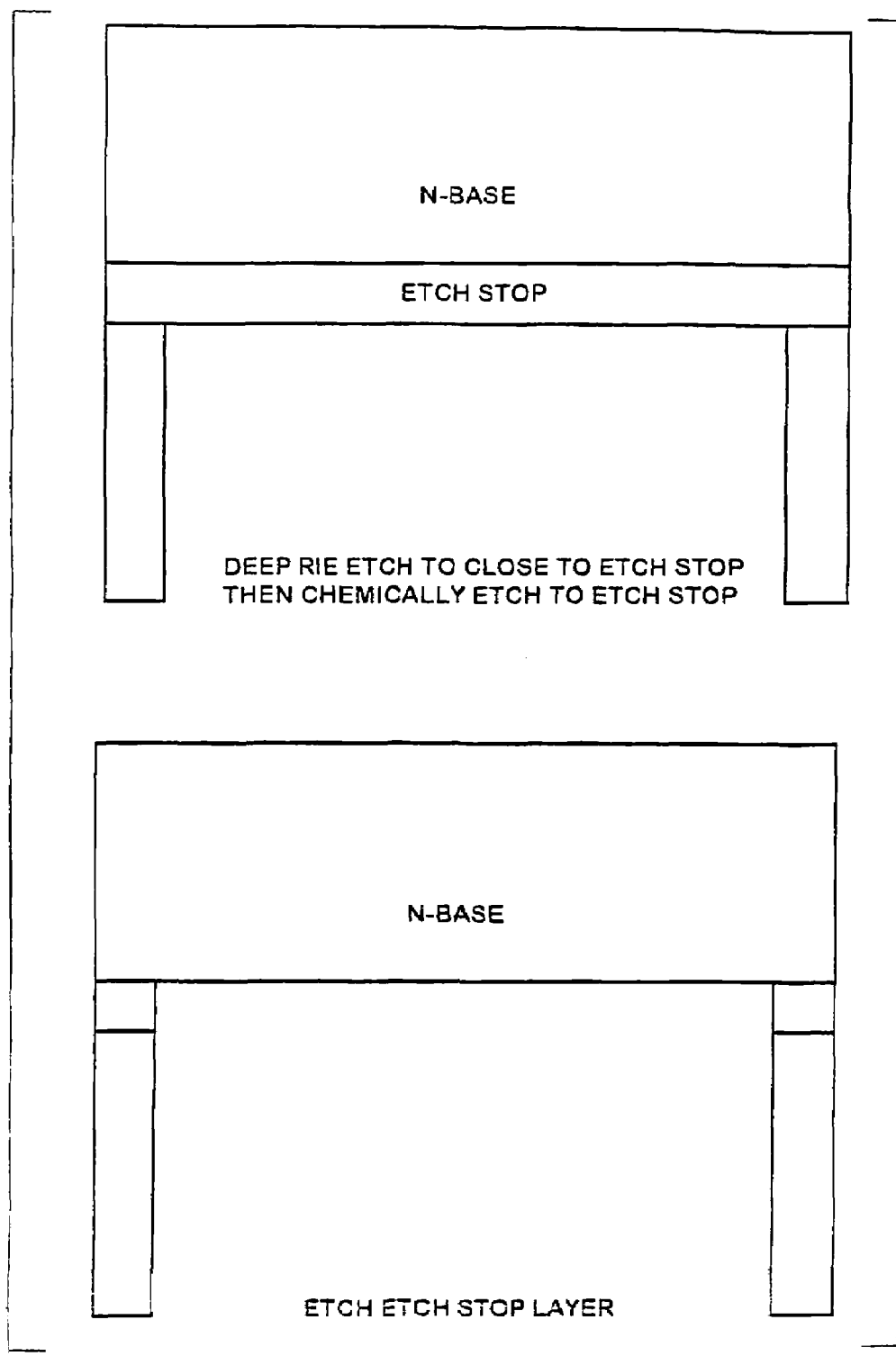
FIG. 9 illustrates an etch stop approach for obtaining uniform etch depth for deep trench etch.

In FIG. 8a an N− base epitaxial layer is grown on an N+ substrate. The Deep RIE trench is etched into the N− base and a P+ implant is made into the bottom of the trench. In FIG. 8b an N base layer is grown on an P+ substrate and an N+ implant is made into the bottom of the trench. In FIG. 8c the N− base layer is grown on a P+ substrate and a Schottky contact is made on the bottom of the trench.

N+ and P+ doped regions can be implemented at the backside of the MOS controlled thyristor in a similar manner as described for the IGBT above.

EXAMPLE 11

Figure 10:
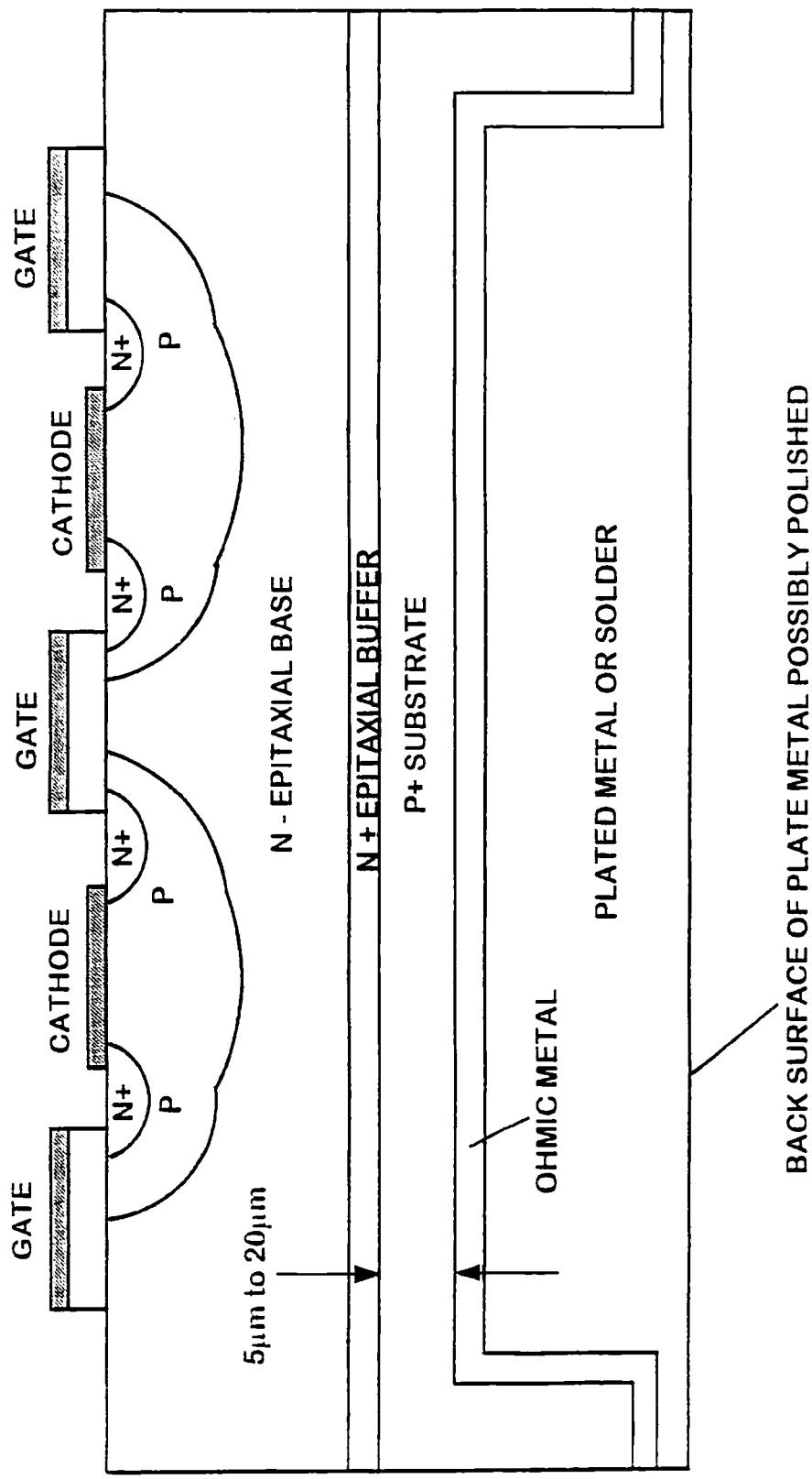
FIG. 10 illustrates a cross section of an IGBT that was made by doing deep RIE etch to within 5 µm to 20 µm of P+ substrate-epitaxial layer interface to obtain reduced substrate resistance and improved thermal conductance. MOSFETs and MOS controlled thyristors can be made in the same manner.

This example produces a high thermal conductance, low substrate resistance IGBT, MOSFET, and MCTs fabricated in the normal manner, but using deep etching to obtain an effectively thin wafer and is illustrated in FIG. 10.

The most common way of making a vertical conducting power IGBT, MOSFET, and MCTs is to grow 25 μm to 100 μm thick epitaxial layer on a N+ or P+ substrate (as appropriate) and then form the appropriate device structure on the front side. In addition to using epitaxial layers, wafer bonding is also becoming more attractive.

FIG. 10 shows an approach to obtain the advantages of high thermal conductance and low substrate resistance using a slight modification of the normal vertical conducting IGBT, MOSFET or MCT process is to fabricate the IGBT, MOSFET, or MCT epi on N+ substrate in the normal manner and then:

1. Thin semiconductor wafer from the backside using grinding and etching to a thickness of approximately 200 μm (or 400 μm).

2. Photolithography define areas for deep etching on the backside of the wafer using Approach 1 to Approach 3 as described above. For Approach 1 above, no alignment is necessary so that a glass plate with patterns can be placed on the back and used to expose the resist.

An even less expensive method to define the regions for the deep RIE etch may be to put a wire mesh (with 20 μm wide wires and 20 μm wide spaces) over the back surface and use this as a mask for deep RIE etching so that a photolithography step is not needed.

3. Deep RIE etch so that a small amount (5 μm to 20 μm) of N+ or P+ substrate (as appropriate) remains and is not etch (For a 200 μm thick wafer with 100 μm thick N− base, the RIE etch depth would be 80 μm to 95 μm). Possibly use a chemical clean up etch after deep RIE.

4. Deposit metal.

5. Anneal metal at 400° C. to 500° C.

6. Possibly plate metal or solder (possibly followed by a polishing step) to increase the strength of the wafer and make contact to the metal in the trench.

In order to better control the depth of the trench etching various etch stopping techniques can be employed. One technique is to use a P+, SiGe P+ doped, SiGe, or SiGeC etch stop to obtain improved uniformity of trench etch depth. For the P+ etch stop approach, the deep RIE trench is etched to within possibly 2-10 μm of the P+ etch stop and then a final selective chemical etch is used to etch the deep trench and stop at the heavily doped (typically >1.times.10.sup.19 cm.sup.−3) P+ region. If it is desired to remove the etch stop, either a non-selective chemical or plasma etch can be used to etch the remaining thickness of the P+ etch stop to reach the N− base region. Ion implants of N+ and P+ dopants can then be made into the bottom of the trench to fabricate the structures shown in FIGS. 1-8 and described in Examples 1-10 above.

A similar approach of using a deep RIE etch to etch close to the etch stop and then using a selective chemical etch to stop at the SiGe P+, SiGe or SiGeC etch stop can be used.

Doping levels of generally greater than 1.times.10.sup.19 cm.sup.−3 are typically required in the P+ etch stop to be effective as an etch stop. Possible techniques to form this P+ etch stop layer include epitaxial growth and wafer bonding. In the case of epitaxial growth, a P++ layer of >1.times.10.sup.19 cm.sup.−3 doping and a N− base layer 25 μm to 100 μm thick is epitax grown on either a P+ or N+ substrate. It may be difficult to achieve a P+ doping layer concentration >1.times.10.sup.19 cm.sup.−3 for epitaxial growth of thick N− base layers because of the high temperatures involved in the epitaxial growth of thick layers (>100° C.). In the case of a wafer bonding, a P++ can be made into either the N+ or P+ substrate or the N− base semiconductor wafer and the wafer is bonded. Low processing temperatures (900° C. to 1000° C.) can be used after wafer bonding to maintain the high P+ doping concentration. The SiGe P+, SiGe or SiGeC etch stop layers will typically be made by epitaxial growth on a semiconductor wafer, however, if thick N− base layers, typically wafer bonding would be used because of the high epitaxial growth temperatures for thick silicon growth (>1100° C.).

Another technique is to utilize electrochemical etching to stop near a PN junction. The electrochemical etch stop technique can be utilized to stop a chemical etch within the depletion region of a reverse biased PN junction. Typically, the P-type silicon side of the PN junction is etched, stopping in the depletion region of at the backside P substrate/N− base layer. The approach that would be used is to deep RIE etch to within possibly 2-10 μm of the PN junction, and use the electrochemical etching technique to stop almost at the PN metallurgical junction. There may be a small thickness of P-semiconductor remaining after the electrochemical etch, so that a final chemical or plasma etch is performed to reach the N− base layer. N+ implants, P+ implants or Schottky contact can be made into the bottom of the trench as described in Examples 1-10 above. The N− base layer can be made on a P or P+ substrates using either epitaxial growth or wafer bonding.

Another technique is to use silicide, eutectic, or refractory metal etch stop obtained by wafer bonding. Silicide, refractory metal, or eutectic (typically gold-silicon eutectic) layers can be made at the interface of the substrate wafer and the N− base layer by wafer bonding. These materials are excellent etch stop layers. If the silicide, eutectic, or refractory metals make ohmic contact to N+ or P+ doping regions on the N− base layer side of the silicide, eutectic, or refractory metal, then it is not necessary to etch away the silicide, eutectic, or refractory metal layer. Because silicide, eutectic, or refractory metals such an excellent etch stop layer, wafer thickness of 400 μm can be used that are thinned to 25 μm in selected regions.

Another technique is to use oxide or nitride etch stop obtain by wafer bonding. Oxide or nitride layers can be made at the interface of the substrate wafer and the N− base layer by wafer bonding. These materials are excellent etch stop layers. The insulator layer would be etched to reach the backside of the N− base layer, and N+ implant, P+ implant, or Schottky metal contacts would be formed to the backside of the N− base layer to implement the structures in Examples 1-10 above and FIGS. 1-8. Because oxide or nitride are such an excellent etch stop layer, wafer thickness of 400 μm can be used that are thinned to 25 μm in selected regions.

Another technique is to use inexpensive high temperature polymers as a glue etch stop. A layer of polymer material will typically convert to amorphous carbon layer when heated at >500° C. to 700° C. Thus, a low cost method of implementing wafer bonding is to use polymers as glues to glue two wafers together with one the wafers being used to form the N− base (after thinning to approximately 100 μm) of a vertical conducting power device. During the high temperature processing steps of the vertical conducting power device, the polymer glue will be converted to an amorphous carbon layer that can act as an etch stop for the deep etch. After the deep etch, the carbon layer will be etched, and N+ implants, P+ implants, or Schottky metal contact will be performed to implement the devices in Examples 7-10 above.

If necessary, multiple etch stops or co-incident etch stop utilizing any of the etch stop approaches in the five techniques discussed above can be used.

A further feature of the invention is that power semiconductor devices can be made using alternate semiconductor materials than those discussed above. Wide bandgap semiconductor materials such as SiC and GaN have a number of advantages for power devices including higher critical field for breakdown and high saturated drift velocity. If sufficiently low doping concentration bulk material can be obtained, the same process steps as describe for the float zone wafers, Examples 1-6. above can be used for SiC or GaN material and can save the cost of an epitaxial growth.

It is understood that the foregoing detailed description is given merely by way of illustration and that many variations may be made therein without departing from the spirit of this invention.

What is claimed as new and desired to be protected by Letters Patent of the United States is:

1. A vertical current conducting device comprising:
a substrate having at least one conductivity type, a thickness of from about 100 μm to 700 μm, a first side, a second side opposite to said first side and at least one trench having a thickness ranging from about at least 10 μm to 400 μm in at least one region on said second side;
an active device located on said first side in a region located at least partially above one of said at least on trench; and
a current electrode disposed on said second side and in electrical contact with one of said at least one trench, said current electrode being operable to provide a vertical current through said substrate to said active device,
wherein said substrate has more than one conductivity type layer or more than one conductivity type layer concentration so that either (a) a depth amount of a first conductivity type layer of said substrate or a depth amount of a first conductivity type layer concentration of said substrate remains or (b) no depth amount of said first conductivity type layer of said substrate or no depth amount of said first conductivity type layer concentration of said substrate remains.

2. A device according to claim 1,
wherein said substrate includes a conductivity type dopant in said one of said at least one trench, and
wherein said one of said at least one trench has thickness ranging from 10 μm to 200 μm.

3. A device according to claim 1, wherein said substrate has either a P conductivity type dopant or an N conductivity type dopant.

4. A device according to claim 1, wherein said at least one trench comprises a pattern of trenches.

5. A device according to claim 4, wherein said pattern of trenches comprises a pattern of randomly orientated trenches.

6. A device according to claim 4, wherein all of said at least one trench are disposed below said active device.

* * * * *